(12) United States Patent
Fujitugu

(10) Patent No.: US 6,734,444 B2
(45) Date of Patent: May 11, 2004

(54) SUBSTRATE TREATMENT DEVICE USING A DIELECTRIC BARRIER DISCHARGE LAMP

(75) Inventor: Hideki Fujitugu, Himeji (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/066,649

(22) Filed: Feb. 6, 2002

(65) Prior Publication Data

US 2002/0113216 A1 Aug. 22, 2002

(30) Foreign Application Priority Data

Feb. 16, 2001 (JP) ........................................ 2001-039621

(51) Int. Cl.$^7$ ................................................. G21G 5/00
(52) U.S. Cl. .................................................... 250/492.1
(58) Field of Search ........................ 250/453.11, 454.11, 250/455.11, 492.1, 492.2; 427/582; 313/507

(56) References Cited

U.S. PATENT DOCUMENTS

| | | | | |
|---|---|---|---|---|
| 4,983,881 A | | 1/1991 | Eliasson et al. ............. | 313/607 |
| 5,510,158 A | * | 4/1996 | Hiramoto et al. ........... | 427/582 |
| 5,763,892 A | * | 6/1998 | Kizaki et al. ............. | 250/492.1 |
| 2001/0022499 A1 | * | 9/2001 | Inayoshi ..................... | 313/607 |

FOREIGN PATENT DOCUMENTS

| JP | 6-314352 | * 11/1996 | ............ H01J/65/04 |
|---|---|---|---|

OTHER PUBLICATIONS

Denki Gakkai Revised Edition, "Discharge Handbook", pp. 262–271.

* cited by examiner

Primary Examiner—John R. Lee
Assistant Examiner—Christopher M. Kalivoda
(74) Attorney, Agent, or Firm—Nixon Peabody LLP; David S. Safran

(57) ABSTRACT

An irradiation treatment device is provided in which uniform irradiation treatment with high speed can be achieved without damaging a substrate, even in the case in which the substrate to be treated is enlarged and exceeds the length of the rod-shaped dielectric barrier discharge lamp. The object is achieved in a substrate treatment device using dielectric barrier discharge lamps in which the dielectric barrier discharge lamps and the substrate are transported relative to one another and in which the surface of this substrate is irradiated with UV light from the dielectric barrier discharge lamps, in that the length for the above described dielectric barrier discharge lamps in the lengthwise direction is less than the length in the direction perpendicular to the transport direction of the substrate. There are at least two dielectric barrier discharge lamps and there is an area of the above described substrate which has been irradiated by one dielectric barrier discharge lamp and there is an area of the above described substrate which has been irradiated by the other dielectric barrier discharge lamp during transport of this substrate such that they come to rest on one another at least in one part, and that with respect to the UV light emitted by the respective dielectric barrier discharge lamp in this area in which superposition occurs, there are light screening means by which a transition is effected between the two lamps.

6 Claims, 4 Drawing Sheets

SUBSTRATE TREATMENT DEVICE USING A DIELECTRIC BARRIER DISCHARGE LAMP

BACKGROUND OF THE INVENTION

1. Field Of The Invention

This invention generally relates to a substrate treatment device using a dielectric barrier discharge lamp. The invention relates especially to a device for irradiation treatment, in which a substrate and a dielectric barrier discharge lamp are moved relative to one another.

2. Description Of Related Art

JP Patent Disclosure Document HEI 2-7353(U.S. Pat. No. 4,983,881) discloses a dielectric barrier discharge lamp in which a discharge vessel is filled with a discharge gas which forms an excimer molecule and in which, by means of a dielectric barrier discharge, which is also called an ozone production discharge or a silent discharge excimer, molecules are formed, as is described in the Discharge Handbook (Elektrogesellschaft, Revised Edition), and in which vacuum UV light is emitted from the excimer molecules.

Recently, on the other hand, as a process for eliminating organic impurities and unnecessary resist which adhere to the surface of the substrate, $UV/O_3$ treatment is carried out using the interaction of UV light and ozone without damaging the substrate.

In this $UV/O_3$ treatment, a low pressure mercury lamp and if necessary also an ozonizer have been used. But if the above described dielectric barrier discharge lamp is used, without using an ozonizer, ozone and a high concentration of active oxygen are obtained and a device is made available where the treatment speed is greatly increased. This technology is disclosed for example in JP Patent Disclosure Document HEI 7-196303 (U.S. Pat. No. 5,510,158).

FIGS. 6(a) and 6(b) are schematic diagrams showing a treatment device using a dielectric barrier discharge lamp as one such $UV/O_3$ treatment. A dielectric barrier discharge lamp 1, hereinafter also called a "discharge lamp" or a "lamp", is located in an essentially box-shaped lamp unit 2. Vacuum UV radiation is emitted onto a substrate P via a transmission window 3 which forms one side of this lamp unit 2. The substrate P is transported in the direction of the arrow (marked black) in the drawings. When the transport is completed the irradiation of the entire substrate surface is ended. Between the transmission window 3 and the substrate P there is a gap of a few millimeters. When oxygen which is present in this gap reacts to the vacuum UV light, active oxygen and ozone are produced. Due to the mutual interaction thereof with the vacuum UV light, treatment and elimination of organic impurities or the like can be done.

FIG. 6(b) is a schematic in which the arrangement shown in FIG. 6(a) is viewed from underneath. In FIG. 6(b) the lengthwise direction of the essentially rod-shaped dielectric barrier discharge lamp 1 and the transport direction of the substrate are perpendicular to one another. Since the width X of the substrate is shorter than the length L of the emission part of the dielectric barrier discharge lamp 1, treatment in the manner of line irradiation according to the transport of the substrate P is enabled. The transmission window 3 is not shown in FIG. 6(b).

Recently however, substrates have become larger and larger in an effort to increase production efficiency. Specifically, substrates which conventionally have a size of 680 mm×880 mm have increased to a size of roughly 1000 mm×1200 mm. The length of the direction perpendicular to the transport direction (X in FIG. 6(b)) therefore becomes larger than the length L of the emission portion of the discharge lamp. Only by simple transport of the substrate the entire region of the substrate surface can no longer be irradiated.

This problem could be solved perhaps by using an optical system, such as a reflector, a lens, or the like, if a general light source device were to be used, i.e., a device in which a conventional lamp, i.e., not a dielectric barrier discharge lamp, but a low pressure mercury lamp, a high pressure mercury lamp, a fluorescent lamp, a filament lamp, or the like, is used as a light source. However, in a dielectric barrier discharge lamp, its radiant light is short, i.e., it has a wavelength of less than or equal to 200 nm (called vacuum UV light). When an optical system such as a reflector or the like is used, the problem of damage, such as degradation of the UV radiation, or the like, clearly arises. When the UV radiation is exposed to an oxygen atmosphere, it is easily absorbed. Therefore, a measure such as production of an atmosphere of an inert gas in the lamp vicinity or a similar measure is necessary. Thus, there is the difficulty of arranging a complex optical system in an inert gas atmosphere and the structural limitation that the light transmission window and the substrate must be brought extremely close to one another arise. Therefore, it is not possible to react to the enlargement of the substrate by using an optical system and a conventional lamp. This is a problem which is particular to a light source device using a dielectric barrier discharge lamp. In a low pressure mercury lamp, UV light with a wavelength of 185 nm is also emitted. In a dielectric barrier discharge lamp, UV light with shorter wavelengths of 172 nm and 126 nm is emitted. The above described damage to the optical system, the absorption of UV radiation by oxygen, and the proximity to the substrate are common problems.

It can be theoretically imagined that if the substrate length is increased, the emission part of the discharge lamp could likewise be increased. However, elongating of the discharge lamp entails a difficulty with respect to production and is not simple either with respect to maintaining uniform luminous operation in the lengthwise direction of the lamp.

This is especially true since in a dielectric barrier discharge lamp the quartz glass comprising the discharge lamp is used as a dielectric, and in the lengthwise direction, the thickness of the quartz glass and the adhesive properties of the electrodes must be made uniform. The applied voltage is also high. Therefore, enlargement of the discharge lamp is difficult in practice and raises safety issues as well.

Furthermore, a method can also be imagined in which the substrate is transported separately several times and the relationship of the arrangement between the substrate and the lamp can be changed such that the irradiation area changes with each transport. This method however sacrifices treatment time and furthermore entails the difficulty of setting of the substrate and the irradiation area for each transport.

As is shown in FIG. 7, an arrangement can be imagined in which within a lamp unit there are discharge lamps next to one another. FIG. 7 corresponds to FIG. 6(b). This arrangement makes it possible to advantageously react to a large substrate P by a simple arrangement of placing lamps next to one another.

From the standpoint of size this arrangement makes it possible to overcome the problems associated with enlargement of the substrate P. But this arrangement again causes another problem. That is, on the boundaries between the area irradiated by one discharge lamp and the area irradiated by the other discharge lamp, it is extremely difficult to unify the amount of irradiation light. Depending on the relationship of the arrangement of the discharge lamps, an area is formed which is not irradiated at all, or an area which is irradiated twice by the two discharge lamps is formed. For example, for the application of cleaning treatment to remove organic impurities, this leads to no cleaning treatment taking place when an area is formed which is not irradiated at all. In the area which is irradiated twice, cleaning treatment is still possible. But here, due to the excess irradiation of the substrate with the vacuum UV radiation the problem arises in that the substrate surface is undesirably damaged. Furthermore, under certain circumstances, the substrate surface is not uniformly treated, resulting in non-uniformity.

In treatment by direct irradiation of the substrate surface with vacuum UV light, and by using a photochemical reaction of the vacuum UV light with the substrate surface for other applications, in the area which is not irradiated a photochemical reaction does not take place, as in the above described cleaning treatment. Here, in the area irradiated twice, the unwanted treatment result is that as a consequence of the intense photochemical reaction, the substrate surface is not uniformly treated.

SUMMARY OF THE INVENTION

An exemplary object of the invention is to devise an irradiation treatment device in which a high speed uniform irradiation treatment can be achieved without damaging the substrate, even in the case in which the substrate to be treated is enlarged and exceeds the length of the rod-shaped dielectric barrier discharge lamp.

The exemplary object is achieved in a substrate treatment device using dielectric barrier discharge lamps in which the substrate is transported with respect to the dielectric barrier discharge lamps and in which the surface of the substrate is irradiated with UV light from the dielectric barrier discharge lamps. Since the length for the above described dielectric barrier discharge lamps in the lengthwise direction is less than the length in the direction perpendicular to the transport direction of the above described substrate, and since there are at least two dielectric barrier discharge lamps, there is an area of the substrate which is irradiated by one dielectric barrier discharge lamp and there is an area that is irradiated by the other dielectric barrier discharge lamp. With respect to the UV light emitted by the respective dielectric barrier discharge lamps in the overlapping area, there are light screening means which transition the effect between the two lamps.

By this arrangement, firstly, by using several rod-shaped dielectric barrier discharge lamps, it is possible to advantageously compensate for the increase in size of the substrate without enlarging the discharge lamps. Secondly, by formation of a double-irradiated area at least in one part of the substrate which is irradiated with vacuum UV light, the disadvantage associated with the boundaries of the irradiation areas can be eliminated. Thirdly, through the arrangement of the light screening means, by which the irradiation areas are changed according to the transport of the substrate with respect to this double-irradiated area of the substrate, damage to the substrate by excess irradiation can be prevented and moreover scattering of the treatment by non-uniform irradiation can be reduced.

Another exemplary object is achieved in the substrate treatment device in that instead of transporting the above described substrate in relation to the dielectric barrier discharge lamps, the above described substrate remains fixed, and the dielectric barrier discharge lamps are moved and illuminated to emit thereby performing the irradiation treatment.

The object is achieved in another version of the invention in a substrate treatment device in that the above described light screening means are arranged such that the amount of irradiation per unit of area on the substrate becomes essentially uniform after treatment.

The arrangement of the light screening means makes the amount of irradiation per unit of area on the substrate completely uniform. Thus the disadvantage of non-uniformity of treatment can be completely eliminated.

The object is achieved in another version of the invention in a substrate treatment device in that the dielectric barrier discharge lamps are located in an essentially box-shaped lamp unit, with one side provided with light transmission windows, and the respective light screening means is a light screening plate which is located in this light transmission window.

These and other features and advantages of this invention are described in, or are apparent from, the following detailed description of the embodiments.

BRIEF DESCRIPTION OF THE DRAWINGS

The embodiments of the invention will be described in detail, with reference to the following figures wherein.

DETAILED DESCRIPTION OF THE INVENTION

Figure 1A:
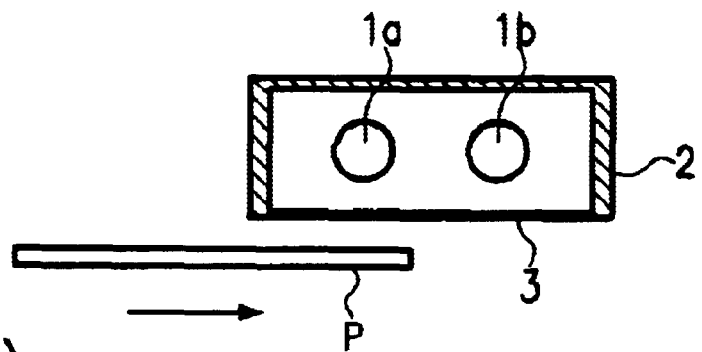
FIGS. 1(a) and 1(b) each illustrate the substrate treatment device according to this invention.
Figure 1B:
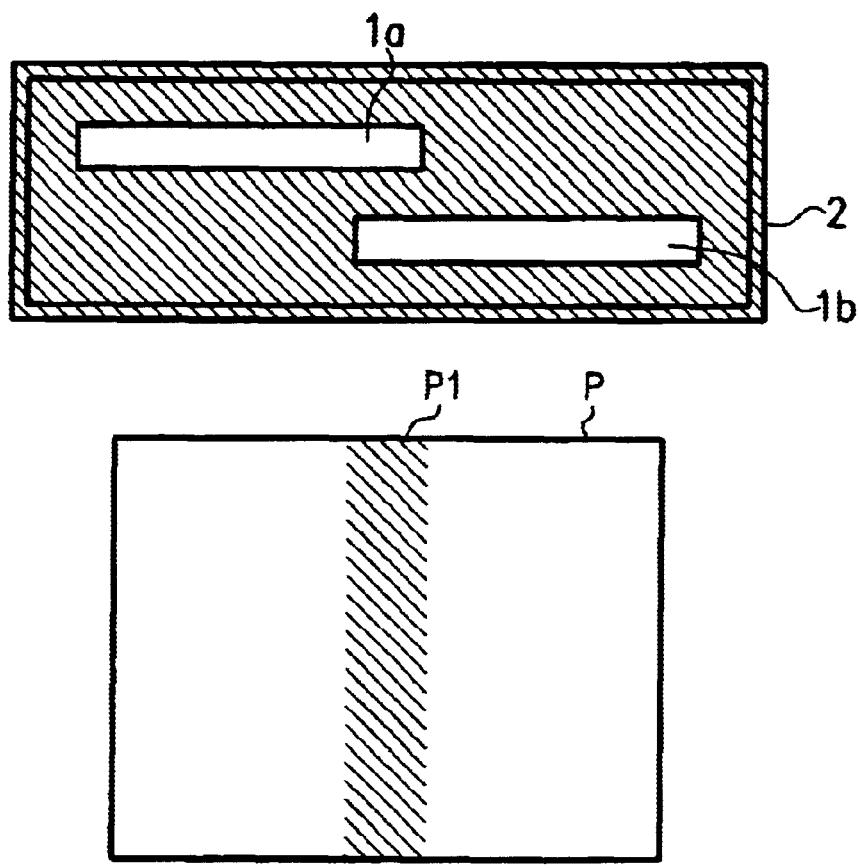

FIGS. 1(a) and 1(b) each show a substrate treatment device using dielectric barrier discharge lamps. FIG. 1(a) shows the device and the substrate in a cross sectional representation. FIG. 1(b) shows the state of the arrangement as shown in FIG. 1(a) viewed from underneath, i.e., the transmission window side. FIG. 1(b) is a representation illustrating the positional relationship between the discharge lamps and the substrate. Therefore, in FIG. 1(b) neither the transmission windows are shown nor the relationship of the substrate and the lamp unit to scale.

The dielectric barrier discharge lamp 1, hereinafter also called a "discharge lamp" or a "lamp", has an essentially rod shape. There are at least two lamps located in an essentially box-shaped lamp unit 2, one side of which is made as a transmission window 3 via which UV radiation, and especially vacuum UV radiation, is emitted onto a substrate P. The substrate P is transported in the direction of the arrow, as shown in the drawings. When transport is completed, the irradiation of the entire substrate surface is complete. Between the transmission window 3 and the substrate P there is a gap of a few millimeters. When oxygen which is present in this gap reacts to the vacuum UV light, active oxygen and ozone are produced. Due to the mutual interaction thereof with the vacuum UV light, treatment, such as elimination of organic impurities, or the like, can be carried out. Here the lamp unit 2 consists of, for example, stainless steel. One of its side walls is provided with a gas feed opening (not shown), while the other side wall is provided with a gas outlet opening (not shown). An inert gas such as nitrogen gas or the like is delivered from this gas feed opening. The inert gas together with the remaining oxygen gas is emitted from the gas outlet opening.

When the substrate P is transported and irradiation treatment with the vacuum UV radiation takes place, as shown in FIG. 1(b), an area P1 is formed in part of the substrate P and is irradiated both with the discharge lamp 1a and also the discharge lamp 1b. With the arrangement of the at least two discharge lamps 1a and 1b, the area P1 is formed.

Figure 2A:
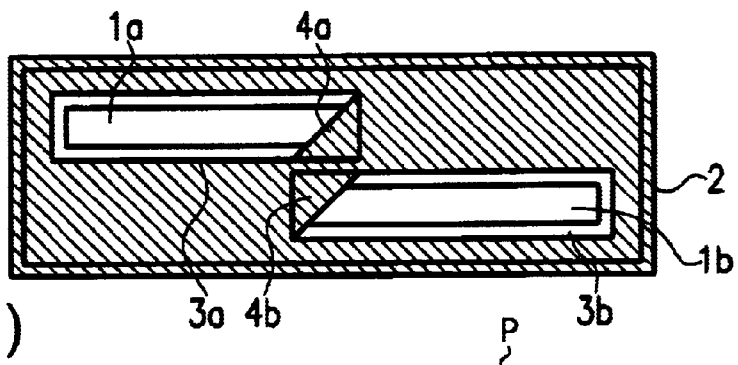
FIGS. 2(a) and 2(b) each illustrate the substrate treatment device according to this invention.
Figure 2B:
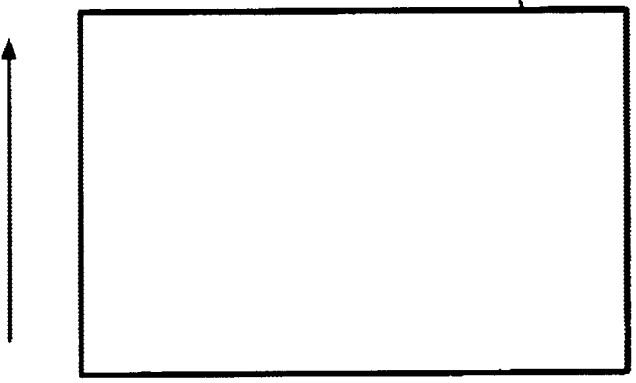

FIG. 2(a) shows, like FIG. 1(b), the state of the lamp unit 2 viewed from underneath. FIG. 2(b) shows according to FIG. 2(a) the substrate and its transport state for information purposes. The bottom plate of the lamp unit 2 is provided with quartz glass 3 (3a, 3b) as the light transmission window according to the discharge lamps 1 (1a, 1b). The area outside the light transmission windows is made of stainless steel. According to the above described irradiation area P1, in which superposition takes place, light screening plates 4 (4a, 4b) are mounted on the respective light transmission window 3 (3a, 3b). These light screening plates 4 comprise, for example, aluminum and are arranged such that the sharp-cornered transmission windows are partially screened. By means of this arrangement, the area irradiated with the lamp 1a and the area irradiated with the lamp 1b are made such that directly underneath the light screening plates the area irradiated with the two lamps changes according to the respective transport of the substrate. On the borders between the areas irradiated with the two discharge lamps, there exists an area with superimposed irradiation, i.e., the area P1 in FIG. 1(b)), which is formed. Moreover, the amount of irradiation light can be made uniform in this area compared to other areas. The light screening plates 4 need not comprise a material different from that of unit 2. This means that the shape of the light transmission window can in itself also be identical to the shape illustrated in FIG. 2(a).

By one such measure, even when the substrate is large, it is possible to advantageously prevent un-irradiated areas and the like from being formed. Furthermore, the disadvantage that some of the substrate is irradiated with excess UV radiation thereby damaging the substrate is eliminated. Furthermore, the non-uniformity of treatment is prevented by irradiation with the UV radiation in a roughly equivalent amount.

The substrate treatment device can be determined not only by the arrangements of the discharge lamps, the light transmission windows, and the light shielding plates. Alternatives are possible taking into account the following exemplary conditions regarding the irradiation areas and the substrate. For example, in the case in which the radiant light from the lamps broadens, i.e., scatters, and is emitted onto the substrate, the area irradiated with the respective lamp must be measured and the cause and effect relationship regulated by the light screening means must be checked.

The exemplary substrate treatment device is made as an extremely general application configuration such that the distance between the light transmission window and the substrate is a few millimeters, with a maximum of roughly 10 mm. The reason for this is that the vacuum UV light emitted by the dielectric barrier discharge lamps has a short radiation wavelength of less than or equal to 200 nm, as described above, and therefore for long residence in an oxygen atmosphere it is absorbed by oxygen. Since the distance between the window and the substrate is small, the light transmitted by the light transmission windows is emitted and broadens essentially in a straight line onto the corresponding substrate surface. It is also conventional for the same discharge lamps to be used and operated with the same rated output. In one such case, specifically in the case of a distance between the light transmission windows and the substrate is less than or equal to 10 mm, as a result of the arrangement and the area of the light transmission windows it is possible to essentially roughly determine the irradiation areas in the substrate and the above described area in which superposition takes place without checking the irradiation areas in the substrate.

With respect to scattering of surface treatment, it is most advantageous to make the amount of irradiation per unit of area uniform on the entire surface of the substrate to be treated. This can be achieved in the above described case where the distance between the light transmission windows and the substrate is less than or equal to 10 mm by using discharge lamps, light transmission windows and light screening plates with the same arrangements, the same sizes and the same operating conditions and a symmetrical arrangement.

Figure 3A:
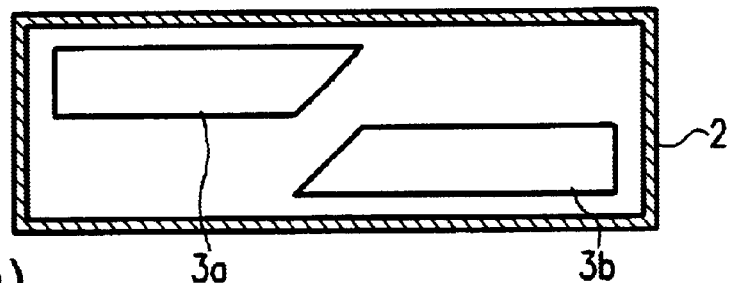
FIGS. 3(a) and 3(b) each illustrate the substrate treatment device according to this invention.
Figure 3B:
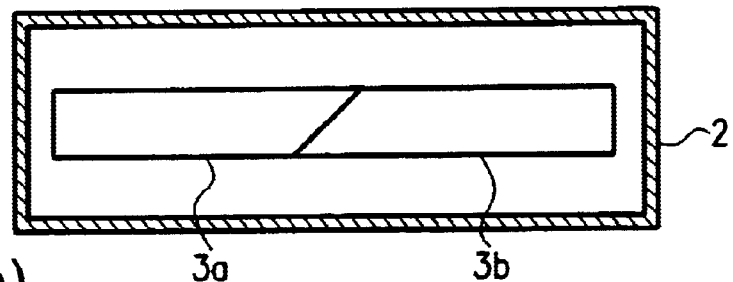

This point is illustrated using, for example, FIGS. 3(a) and (b). FIGS. 3(a) and (b) show, like FIG. 2(b), a lamp unit viewed from underneath, with only the light transmission areas after screening by the screening plates being shown and the discharge lamps and the like not shown. FIG. 3(b) is an exemplary representation for an embodiment of the invention illustrating where the two transmission areas 3a and 3b shown in FIG. 3(a) have been temporarily pushed in the transport direction of the substrate. If in this case the two transmission areas agree with one another without forming an area for superposition, the substrate in the lengthwise direction of the transmission windows is irradiated with uniform UV radiation. In this case, the uniform UV irradiation is enabled. Therefore the advantage is that the non-uniformity of treatment is eliminated.

Figure 4A:
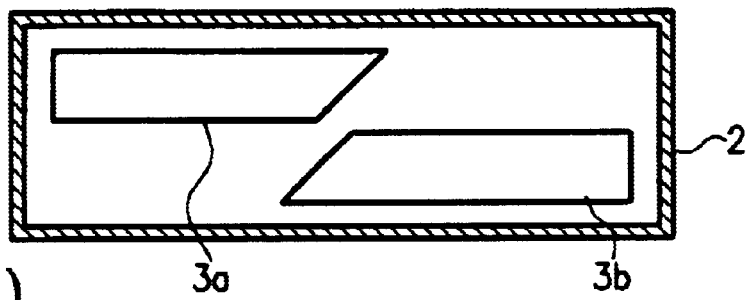
FIGS. 4(a) and 4(b) each illustrate the substrate treatment device according to this invention.
Figure 4B:
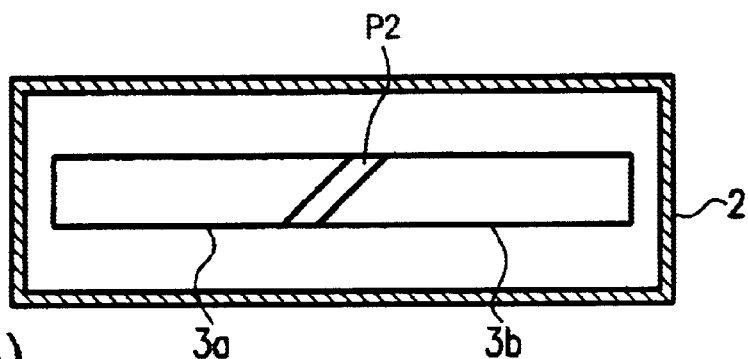

FIGS. 4(a) and (b) also illustrate an exemplary embodiment similar to that illustrated in FIGS. 3(a) and (b). In this exemplary embodiment, where the structure and the size of the light transmission areas 3a and 3b are identical to one another, a positional relationship can arise in which the two transmission areas come to rest one top of one another, such as in the case in which the light transmission areas 3a and 3b shown in FIG. 4(b) are temporarily pushed in the transport direction of the substrate. In this case, completely uniform irradiation cannot be achieved. Therefore, excess UV irradiation can be advantageously prevented. Thus, damage to the substrate can be prevented and, while at the same time the issues associated with non-uniformity of treatment can be reduced.

Figure 5A:
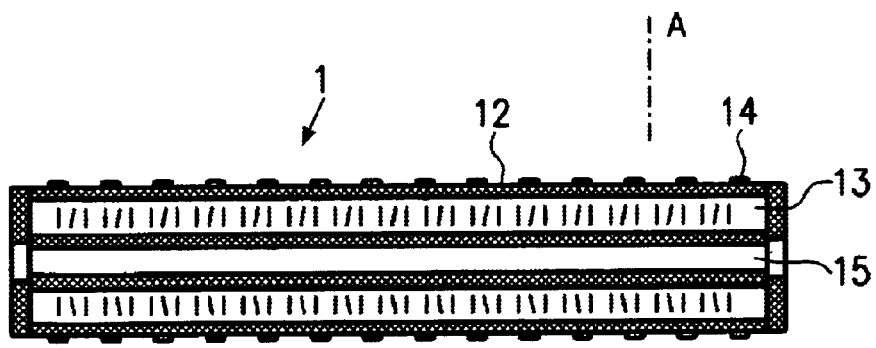
FIGS. 5(a) and 5(b) each show a schematic of the overall arrangement of a dielectric barrier discharge lamp.
Figure 5B:
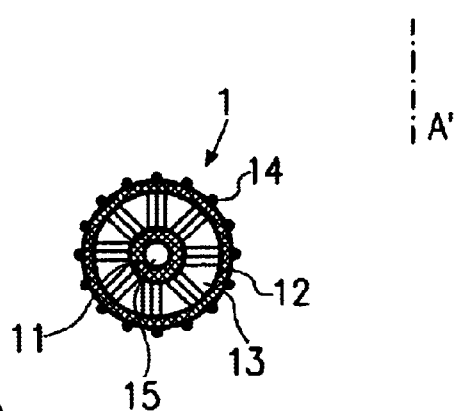
Figure 6A:
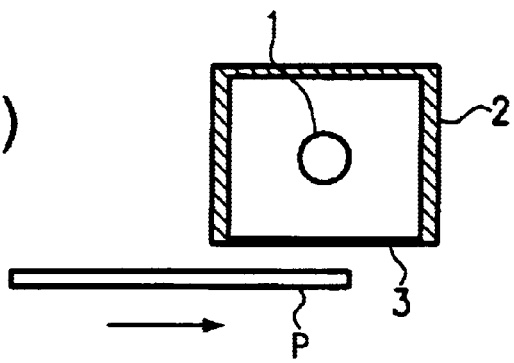
FIGS. 6(a) and (b) each show a schematic of a conventional substrate treatment device.
Figure 6B:
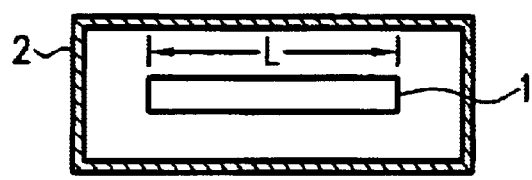
Figure 6B:
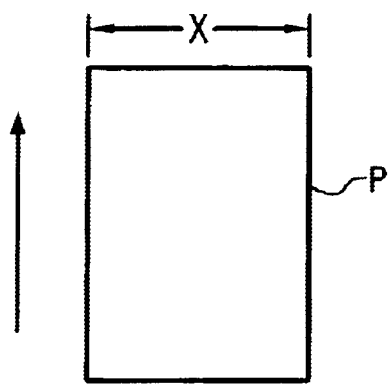
Figure 7:
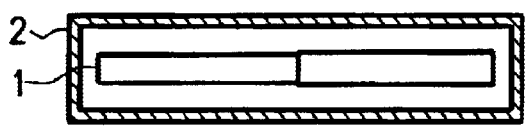
FIG. 7 shows a schematic of a prior art substrate treatment device.
Figure 7:
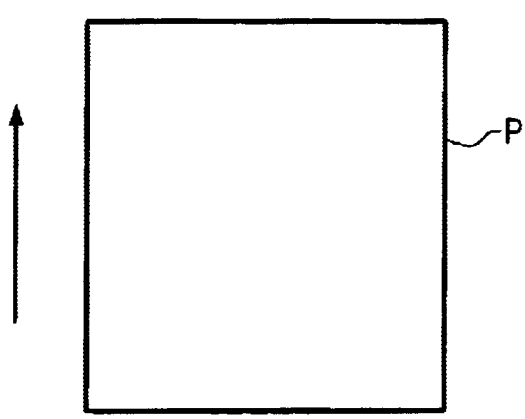

An exemplary dielectric barrier discharge lamp is described below. FIG. 5(a) shows the entire arrangement of the dielectric barrier discharge lamp in a cross section. FIG. 5(b) is a sectional drawing according to line A-A' shown in FIG. 5(a). The dielectric barrier discharge lamp 1 has an overall cylindrical shape and comprises, for example, synthetic quartz glass which acts as the dielectric during a dielectric barrier discharge and moreover transmits vacuum UV light. In the discharge lamp 1, an inside tube 11 and an outside tube 12 are located coaxially to one another, thus forming a double cylinder. By sealing the two ends, between the inside tube 11 and the outside tube 12 a discharge space 13 is formed in which through a dielectric barrier discharge, excimer molecules are formed. Moreover a discharge gas, for example xenon gas, is added, from which vacuum UV light is emitted from these excimer molecules. Numerical values by way of example are given below.

In an exemplary discharge lamp 1, the total length is 800 mm, the outside diameter is 27 mm, the outside diameter of the inside tube 11 is 16 mm, the thickness of the inside tube 11 and the outside tube 12 is 1 mm and the discharge lamp 1 is operated with 400 W.

The outer side of the outside tube 12 is provided with a network-like electrode 14. Within the inside tube 11 there is an inside electrode 15. The network-like electrode 14 is formed seamlessly and overall has a spring like property. Thus, good adhesive properties for the outside tube 12 can be obtained. The inside electrode 15 is tubular or can be essentially C-shaped with a partial gap in cross section and is located directly adjoining the inside tube 11. In the discharge space there can be a getter if necessary.

Between the network-like electrode 14 and the inside tube 15, an alternating current source (not shown) is connected, from which excimer molecules are formed in the discharge space 13 and vacuum UV light is emitted. In the case in which the discharge gas is xenon gas, light with a wavelength of 172 nm is emitted.

The dielectric barrier discharge lamp is not necessarily limited to the above described arrangement, but can also have an overall right parallel piped shape instead of an overall cylindrical shape. Furthermore, one of the electrodes can be present in the discharge space. Likewise, all discharge lamps using dielectric barrier discharge can be used with equal success.

In the above described embodiment a specific example is described in which the lamp unit is attached and the substrate is transported. But the invention is not limited thereto, and as discussed above, the lamp unit can be transported and the substrate fixed. An arrangement in which the two are moved relative to one another would also produce acceptable results.

Furthermore, the number of discharge lamps present in the lamp unit is not limited to two, but can comprise more than two discharge lamps. In this case, there is the case in which at least two discharge lamps are located next to one another in the transport direction of the substrate, and also the case in which at least two discharge lamps are located next to one another in the lengthwise direction of the lamps.

Furthermore, the light screening means is not limited to that which comprises one lamp screening plate, but can also include an alternative embodiment in which, for example, a light screening film can be applied to the light transmission window. However, generally speaking there should be only one light transmission window arranged such that it forms the light screening area.

In the above described embodiment, in the lamp unit there were two discharge lamps. But the invention can also be implemented through an arrangement in which in the lamp unit there is only one discharge lamp and there being more than one lamp units.

Furthermore, an alternative exemplary can also be imagined in which the luminous outputs for several discharge lamps and the lamp arrangements can differ from one to another.

In the above described embodiment, a case was described in which in the lamp unit the light transmission windows are formed by using a light transmission glass. But the light transmission glass is not always needed if the defect caused by the attenuation of the vacuum UV light by oxygen can be advantageously eliminated. In this case, the surface of the light radiation opening located in the lamp unit can be adjusted in relation to the irradiation areas.

As was described above, the exemplary features of the substrate treatment device are that it has an arrangement in which an area is formed which is irradiated with several discharge lamps, and second, that there are light screening plates by which in this area the amount of irradiation is modified in relation to the transportation conditions of the substrate.

Through the use of this first feature, it is possible to overcome the difficulties associated with the enlargement of the substrate encountered with conventional discharge lamps and moreover prevent an un-irradiated area from being formed. By means of the second feature, at least the disadvantage of damage of the substrate is advantageously eliminated from excess UV irradiation. Furthermore, by irradiation with UV radiation in a roughly identical amount, the non-uniformity of treatment can also be prevented.

It is, therefore, apparent that there has been provided, in accordance with the present invention, a substrate treatment device. While this invention has been described in conjunction with a number of embodiments, it is evident that many alternatives, modifications, and variations would be or are apparent to those of ordinary skill in the applicable arts. Accordingly, the disclosure is intended to embrace all such alternatives, modifications, equivalents and variations that are within the spirit and scope of this invention.

I claim:

1. A substrate treatment device comprising:
   at least two dielectric barrier discharge lamps; a substrate which is moved in relation to the at least one dielectric barrier discharge lamp thereby irradiating the surface of the substrate with UV light from the at least two dielectric barrier discharge lamps, wherein a length for the at least two dielectric barrier discharge lamps in the lengthwise direction is less than a length of the transport direction of the substrate;
   a first area of the substrate which has been irradiated by one dielectric barrier discharge lamp;
   a second area of the substrate which has been irradiated by an other dielectric barrier discharge lamp, such that during moving of the substrate, the first and second areas have an overlapping portion; and
   a light screening means that substantially unifies light between the two lamps.

2. A substrate treatment device using dielectric barrier discharge lamps which are transported with respect to a substrate to be irradiated, and which irradiate the surface of this substrate with UV light comprising:
   at least two dielectric barrier discharge lamps, wherein the length of the dielectric barrier discharge lamps in a lengthwise direction is less than a length in the direction perpendicular to the transport direction of the substrate;
   a first area of the substrate which has been irradiated by one dielectric barrier discharge lamp and a second area of the substrate which has been irradiated by the other dielectric barrier discharge lamp, such that during transport of the substrate the first and second areas have an overlapping portion; and
   a light screening means which that substantially unifies light between the two dielectric barrier discharge lamps.

3. The substrate treatment device of claim 1, wherein light screening means are arranged such that the amount of irradiation per unit of area on the substrate becomes essentially uniform after transport treatment.

4. The substrate treatment device of claim 2, wherein the light screening means are arranged such that the amount of irradiation per unit of area on the substrate becomes essentially uniform after transport treatment.

5. The substrate treatment device of claim 1, wherein the dielectric barrier discharge lamps are located in an essentially box-shaped lamp unit, with one side provided with light transmission windows, and wherein the respective light screening means is a light screening plate which is located in the light transmission window.

6. The substrate treatment device of claim 2, wherein the dielectric barrier discharge lamps are located in an essentially box-shaped lamp unit, with one side provided with light transmission windows, and wherein the respective light screening means is a light screening plate which is located in the light transmission window.

* * * * *